United States Patent
Brunstetter

(10) Patent No.: US 10,660,241 B2
(45) Date of Patent: May 19, 2020

(54) COOLING UNIT ENERGY OPTIMIZATION VIA SMART SUPPLY AIR TEMPERATURE SETPOINT CONTROL

(71) Applicant: Vertiv Corporation, Columbus, OH (US)

(72) Inventor: Craig A. Brunstetter, Sunbury, OH (US)

(73) Assignee: Vertiv Corporation, Columbus, OH (US)

(*) Notice: Subject to any disclaimer, the term of this patent is extended or adjusted under 35 U.S.C. 154(b) by 77 days.

(21) Appl. No.: 16/123,450

(22) Filed: Sep. 6, 2018

(65) Prior Publication Data

US 2019/0075687 A1   Mar. 7, 2019

Related U.S. Application Data

(60) Provisional application No. 62/554,785, filed on Sep. 6, 2017.

(51) Int. Cl.
*H05K 7/20* (2006.01)
*G05B 13/02* (2006.01)

(52) U.S. Cl.
CPC ....... *H05K 7/20836* (2013.01); *G05B 13/027* (2013.01); *H05K 7/20745* (2013.01);
(Continued)

(58) Field of Classification Search
None
See application file for complete search history.

(56) References Cited

U.S. PATENT DOCUMENTS 5,355,305 A   10/1994   Seem et al.
5,506,768 A   4/1996   Seem et al.
(Continued)

FOREIGN PATENT DOCUMENTS

EP   2490088 A2   8/2012
WO   WO-99005578 A1   2/1999
(Continued)

OTHER PUBLICATIONS

International Search Report and Written Opinion mailed in corresponding PCT International Application No. PCT/US2018/049734 dated Dec. 24, 2018, 9 pp.
(Continued)

*Primary Examiner* — Ramesh B Patel
(74) *Attorney, Agent, or Firm* — Harness, Dickey & Pierce, P.L.C.

(57) ABSTRACT

The present disclosure relates to a system for controlling a supply air temperature adjustment for a cooling unit to optimize operation of the cooling unit with respect to at least one of room air temperature and humidity requirements. The system uses a controller for implementing: a machine learning module configured to select which portion or portions of acquired data pertaining to operation of the cooling unit will be utilized; and a neural network model which uses information supplied by the machine learning module and learns an operational behavior of the cooling unit, and wherein the machine learning module performs supervised learning and regression for the neural network model, and wherein the neural network model uses information supplied by the machine learning module for generating an output. The controller also implements an optimization module which receives the output from the neural network model and which implements a global optimization routine, using unit power consumption of the cooling unit as the objective (Continued)

function, to produce a supply air temperature set point for use by the cooling unit which optimizes an operating parameter of the cooling unit.

13 Claims, 6 Drawing Sheets

(52) U.S. Cl.
CPC .............. G05B 2219/25255 (2013.01); G05B 2219/2614 (2013.01)

(56) References Cited

U.S. PATENT DOCUMENTS

| | | | |
|---|---|---|---|
| 5,544,039 A | 8/1996 | Hiroi | |
| 5,568,377 A | 10/1996 | Seem et al. | |
| 6,622,925 B2 | 9/2003 | Carner et al. | |
| 6,937,909 B2 | 8/2005 | Seem | |
| 7,117,129 B1 | 10/2006 | Bash et al. | |
| 7,315,768 B2 | 1/2008 | Dang et al. | |
| 7,331,191 B2 | 2/2008 | He et al. | |
| 7,890,215 B2 | 2/2011 | Duncan | |
| 7,979,250 B2 * | 7/2011 | Archibald | G06F 17/5004 361/600 |
| 8,331,237 B2 | 12/2012 | Umeda | |
| 8,406,929 B2 | 3/2013 | Duncan | |
| 8,560,126 B2 | 10/2013 | Vass et al. | |
| 8,560,236 B1 | 10/2013 | Zahir et al. | |
| 8,688,243 B2 | 4/2014 | Federspiel et al. | |
| 8,793,003 B2 | 7/2014 | Laughman et al. | |
| 8,854,822 B2 | 10/2014 | Hazzard et al. | |
| 8,917,513 B1 | 12/2014 | Hazzard | |
| 8,996,141 B1 | 3/2015 | Alsaleem et al. | |
| 9,046,897 B2 | 6/2015 | Klinger | |
| 9,091,496 B2 | 7/2015 | Imwalle et al. | |
| 9,158,345 B1 | 10/2015 | Rice et al. | |
| 9,261,288 B2 | 2/2016 | Okamoto et al. | |
| 9,278,303 B1 | 3/2016 | Somani et al. | |
| 9,291,358 B2 | 3/2016 | Federspiel et al. | |
| 9,534,822 B2 | 1/2017 | Karkhanis et al. | |
| 9,664,400 B2 | 5/2017 | Wroblewski et al. | |
| 10,386,800 B2 * | 8/2019 | Ahmed | G05B 15/02 |
| 2004/0256473 A1 | 12/2004 | Hull et al. | |
| 2006/0020291 A1 | 1/2006 | Gozani et al. | |
| 2007/0026107 A1 | 2/2007 | Wang et al. | |
| 2009/0032235 A1 | 2/2009 | Sullivan et al. | |
| 2009/0138313 A1 * | 5/2009 | Morgan | G06Q 10/06 705/7.23 |
| 2009/0150123 A1 * | 6/2009 | Archibald | G06F 17/5004 703/1 |
| 2009/0319060 A1 | 12/2009 | Wojsznis et al. | |
| 2010/0041327 A1 | 2/2010 | Desler | |
| 2010/0127880 A1 | 5/2010 | Schechter et al. | |
| 2010/0280796 A1 * | 11/2010 | Ramin | F24F 13/0209 702/188 |
| 2011/0184707 A1 | 7/2011 | Miura | |
| 2012/0056321 A1 | 3/2012 | Pagaila | |
| 2012/0232702 A1 | 9/2012 | Vass et al. | |
| 2012/0284216 A1 * | 11/2012 | Hamann | G06F 1/206 706/12 |
| 2013/0084212 A1 | 4/2013 | Kurono et al. | |
| 2013/0098597 A1 | 4/2013 | Fujimoto et al. | |
| 2014/0031956 A1 | 1/2014 | Slessman et al. | |
| 2014/0203151 A1 | 7/2014 | Hennessey et al. | |
| 2014/0222241 A1 | 8/2014 | Ols | |
| 2014/0242899 A1 | 8/2014 | Liu | |
| 2014/0249876 A1 | 9/2014 | Wu et al. | |
| 2014/0277765 A1 | 9/2014 | Karimi et al. | |
| 2014/0303789 A1 | 10/2014 | Wroblewski et al. | |
| 2014/0316581 A1 | 10/2014 | Fadell et al. | |
| 2014/0322427 A1 | 10/2014 | Teranishi et al. | |
| 2014/0322534 A1 | 10/2014 | Suzuki et al. | |
| 2014/0341718 A1 | 11/2014 | Uesugi et al. | |
| 2015/0007595 A1 | 1/2015 | Karkhanis et al. | |
| 2015/0035680 A1 | 2/2015 | Li et al. | |
| 2015/0057812 A1 | 2/2015 | Zhao et al. | |
| 2015/0102101 A1 | 4/2015 | Hazzard | |
| 2015/0178865 A1 * | 6/2015 | Anderson | G05B 17/02 705/7.25 |
| 2015/0200985 A1 | 7/2015 | Feldman et al. | |
| 2015/0206776 A1 | 7/2015 | Mimura | |
| 2015/0227870 A1 | 8/2015 | Noboa et al. | |
| 2015/0233597 A1 | 8/2015 | Dempster et al. | |
| 2015/0310461 A1 * | 10/2015 | Lee | G06Q 30/0202 705/412 |
| 2016/0047578 A1 | 2/2016 | Warren | |
| 2016/0091904 A1 * | 3/2016 | Horesh | G05B 13/02 700/276 |
| 2016/0246269 A1 * | 8/2016 | Ahmed | F24F 11/30 |
| 2017/0261949 A1 * | 9/2017 | Hoffmann | G06N 7/005 |
| 2018/0068034 A1 * | 3/2018 | Zeifman | F24F 11/63 |
| 2018/0228060 A1 * | 8/2018 | Alissa | H05K 7/20836 |
| 2018/0253569 A1 * | 9/2018 | Swierk | G06F 21/554 |
| 2018/0285065 A1 * | 10/2018 | Jeong | G10L 15/22 |

FOREIGN PATENT DOCUMENTS

WO  WO-13075080 A1  5/2013
WO  WO-15013677 A3  11/2015

OTHER PUBLICATIONS

Pyrhonen V-P et al. "Gain-scheduled composite nonlinear feedback control of an exothermic chemical reactor", 2016 European Control Conference (ECC), IEEE, Jun. 29, 2016, pp. 67-73, XP033037432, DOI: 10.1109/ECC.2016.7810265 (retrieved on Jan. 6, 2017].

Salah, Ali Ameur Haj et al. "Controller interpolation methods for transition and control of nonlinear systems", 2016 International Conference on Control, Decision and Information Technologies (CODIT), IEEE, Apr. 6, 2016, pp. 769-773, XP032981249, DOI: 10.1109/CODIT.2016.7593660 [retrieved on Oct. 18, 2016].

King, David. The Benefits of Supply Air Temperature Control in the Datacenter, Aug. 2010 [retrieved on Oct. 30, 2018], Retrieved from https://www.futurefacilities.com/resources/whitepapers/the-benefits-of-supply-air-temperature-control-in-the-datacenter/downloads, 2010,12 pp.

Xiaoqing, Zheng. "Self-Tuning Fuzzy Controller for Air-Conditioning Systems", Thesis Submitted for the Degree of Master of Engineering, National University of Singapore, 2002, 102 pp.

Qadri, Dennis R. et al. "Temperature and pressure control using PI control theory", Feb. 2-May 29, 2012, 72 pp.

Johnson Controls, Inc. Regional Controls Team, Asia. Introduction to PRAC (Pattern Recognition Adaptive Control), White Paper, 2010, 8 pp.

Siemens. Building Technologies. "Control of Ventilation and Air Conditioning Plants", at least one day before Sep. 6, 2017, 39 pp.

* cited by examiner

| NN Model | Variables (X) | | | | | | | Parameters (X1) | | Constraint Parameters (X2) |
|---|---|---|---|---|---|---|---|---|---|---|
| | 1 SAT SP | 2 SAT | 3 RAT | 4 Remote T | 5 Fan % | 6 Cooling Cap | 7 Qin | 1 Remote TSP | 2 Ambient T | 1 Room Load |
| 26a Unit Power | X | X | X | X | X | X | X | X | X | |
| 26b Remote T | | X | | | X | X | X | X | X | X |
| 26c Return T | | X | X | | X | X | X | | X | X |
| 26d Supply T | | | | X | X | | X | | | |
| 26e Fan % | X | X | X | X | | | X | X | | |
| 26f Cooling Capacity | | X | X | | | | X | | | X |

FIGURE 2

Machine Learning Algorithm

- Supervised Learning, Regression, Neural Network Model
- 1 Hidden Layer, 10 neurons
- Train ratio: 0.70
- Validation ratio: 0.15
- Test ratio: 0.15
- Matlab fitnet function in Neural Network Toolbox utilized

FIGURE 3

Optimization Setup

- Global Optimizer with interior-point algorithm
- Objective Function is the NN Model of Unit Power
- SAT bounds 55°F to 75°F
- Heat rejection of unit must be at least the current heat rejection
- Remote Air Temperature bound by setpoint + ½ deadband
- Linear Constraints: SAT must equal SAT SP
- Nonlinear Constraints include NN models for RAT, Return Air Temp, SAT, Fan Speed, Cooling capacity and quantitative model of evaporator heat rejection
- Matlab Global Search Optimization Algorithm Utilized

FIGURE 5

COOLING UNIT ENERGY OPTIMIZATION VIA SMART SUPPLY AIR TEMPERATURE SETPOINT CONTROL

CROSS-REFERENCE TO RELATED APPLICATIONS

This application claims the benefit of U.S. Provisional Application No. 62/554,785, filed on Sep. 6, 2017. The entire disclosure of the above application is incorporated herein by reference.

FIELD

The present disclosure relates to systems and methods for managing data center cooling devices to optimize energy consumption, and more particularly to a system and method which utilizes machine learning and neural network models to control a supply air temperature setpoint for a cooling unit in a manner that optimizes energy usage.

BACKGROUND

This section provides background information related to the present disclosure which is not necessarily prior art.

Energy usage is a major concern for data centers. As data centers becomes larger and larger, often with thousands, or even tens of thousands, of components located in one or more rooms of a data center, the need to minimize energy consumption of CRAC (computer room air conditioner) units, while still providing adequate cooling, is becoming even more important.

One important consideration in managing the energy consumption of data center cooling equipment such as CRAG units is in monitoring and adjusting the supply air temperature ("SAT") to optimize room conditions. Traditionally this has involved a user manually, periodically adjusting a SAT input by the user, in an effort to best meet physical temperature conditions in the room while attempting to minimize energy usage. As will be appreciated, this approach relies on the attention, knowledge and experience of a user in manually selecting the optimal SAT setpoint, as well as other parameters for CRAC units being used within the room. An automated system that is capable of "learning", based on past system behavior, how to best select the SAT setpoint, would enable energy usage to be optimized. Importantly, such an automated, intelligent system would also eliminate reliance, or reduce reliance, on the experience and knowledge of a user in selecting an optimal SAT setpoint to best meet the physical room conditions at any given time.

SUMMARY

This section provides a general summary of the disclosure, and is not a comprehensive disclosure of its full scope or all of its features.

In one aspect the present disclosure relates to a system for controlling a supply air temperature adjustment for a cooling unit to optimize operation of the cooling unit with respect to at least one of room air temperature and humidity requirements. The system may comprise a controller for implementing a machine learning module configured to select which portion or portions of acquired data pertaining to operation of the cooling unit will be utilized. The controller may also implement a neural network model which uses information supplied by the machine learning module and learns an operational behavior of the cooling unit, and wherein the machine learning module performs supervised learning and regression for the neural network model, and wherein the neural network model uses information supplied by the machine learning module for generating an output. The controller may also implement an optimization module which receives the output from the neural network model and which implements a global optimization routine, using unit power consumption of the cooling unit as the objective function, to produce a supply air temperature set point for use by the cooling unit which optimizes an operating parameter of the cooling unit.

In another aspect the present disclosure relates to a system for controlling a supply air temperature adjustment for a cooling unit to optimize operation of the cooling unit with respect to room air temperature and humidity requirements. The system may comprise a controller for implementing a machine learning module, a neural network model, and an optimization module. The machine learning module is configured to select which portion or portions of acquired data pertaining to operation of the cooling unit are utilized. The neural network model uses information supplied by the machine learning module and learns an operational behavior of the cooling unit, and wherein the machine learning module also performs supervised learning and regression for the neural network model. The neural network model uses information supplied by the machine learning module for generating an output. The neural network model has a Unit Power neural network module which receives inputs from at least one other neural network model including:

a remote air temperature (RET) neural network model representing a rack inlet temperature of the cooling unit, the RET neural network model providing an output to the unit power neural network model; or a return air temperature (RAT) neural network model for representing a temperature of air being returned to a given one of the cooling units; or a supply air temperature (SAT) neural network model for representing a temperature of air being generated and output by the cooling unit.

The optimization module receives the output from the neural network model and implements a global optimization routine, using unit power consumption of the cooling unit as the objective function, to produce a supply air temperature set point for use by the cooling unit which optimizes an operating parameter of the cooling unit.

In still another aspect the present disclosure relates to a system for controlling a supply air temperature adjustment for a data center cooling unit to optimize operation of the cooling unit with respect to room air temperature and humidity requirements. The system may comprise a controller for implementing a machine learning module configured to select which portion or portions of acquired data pertaining to operation of the cooling unit are utilized. The controller may also implement a neural network model which uses information supplied by the machine learning module and learns an operational behavior of the cooling unit, and wherein the machine learning module performs supervised learning and regression for the neural network model. The neural network model may include a Unit Power neural network model representing cooling unit power consumption; a remote air temperature (RET) neural network model representing a rack inlet temperature of the cooling unit, the RET neural network model providing an output to the unit power neural network model; a return air temperature (RAT) neural network model for representing a temperature of air being returned to a given one of the cooling units; a supply air temperature (SAT) neural network model for representing a temperature of air being generated and output by the cooling unit; a fan percentage neural network model which represents a percentage of maximum fan speed that a fan of the selected cooling unit is running at; and a cooling capacity (CC) neural network model for representing an overall cooling capacity, in percentage units, of the cooling unit. The Unit Power neural network model may use information supplied by all of the RET, RAT, SAT, fan percentage and CC neural network models in providing an output. The controller may also implement an optimization module which receives the output from the neural network model and which implements a global optimization routine, using unit power consumption of the cooling unit as the objective function, and which produces a supply air temperature set point for use by the cooling unit which optimizes an operating parameter of the cooling unit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2 is chart listing the various neural network models used by the present disclosure as well identifying the outputs used by various models as inputs to other models;

FIG. 3 is a list of various criteria used by the machine learning module of the present disclosure in carrying out a machine learning function;

FIG. 5 is a chart setting forth criteria that are implemented by the optimizer module of the present disclosure;

Corresponding reference numerals indicate corresponding parts throughout the several views of the drawings.

DETAILED DESCRIPTION

Example embodiments will now be described more fully with reference to the accompanying drawings.

Figure 1:
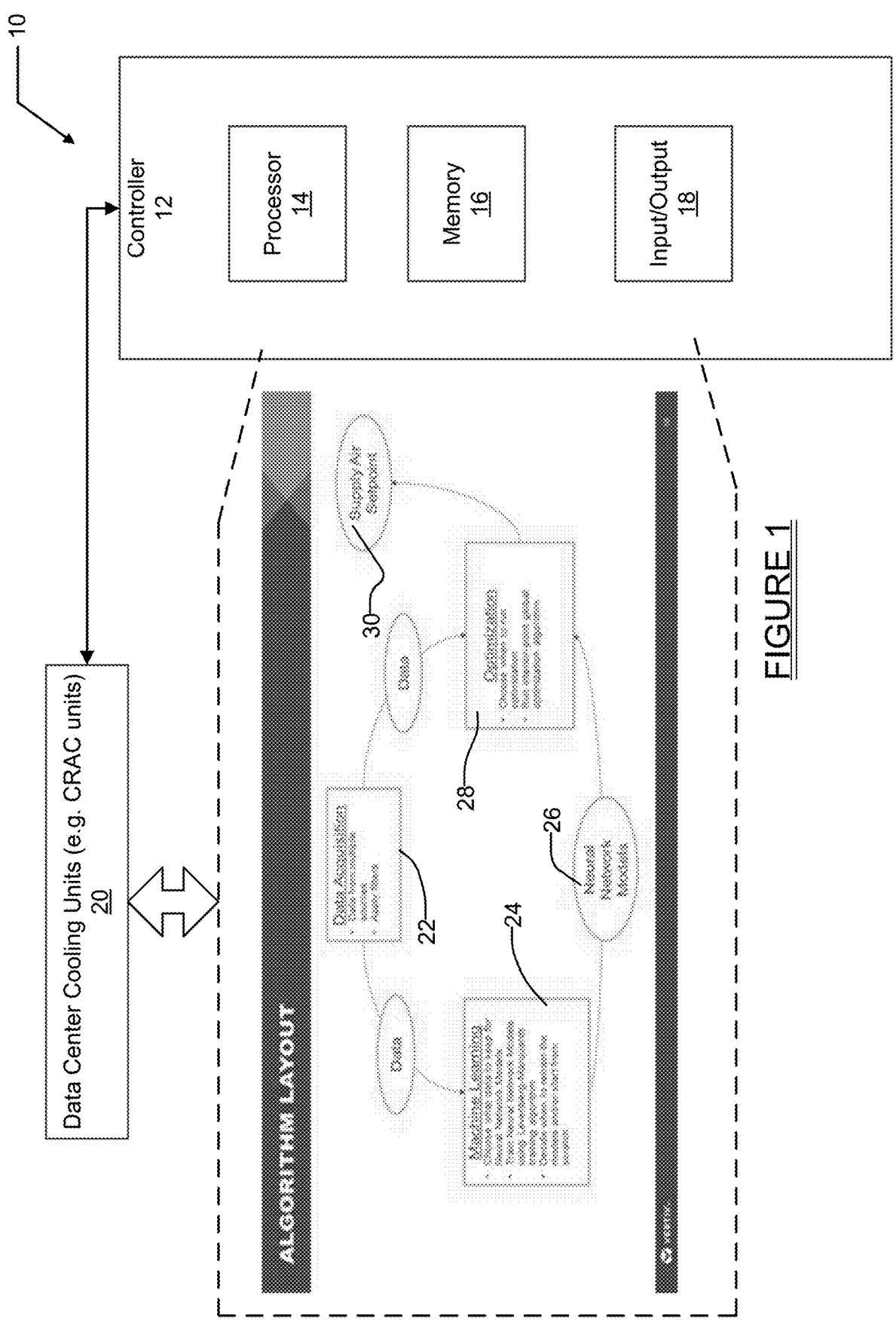
FIG. 1 is a high level flow diagram illustrating various operations performed by one embodiment of the present disclosure.

Referring to FIG. 1 there is shown one example of a system 10 for implementing a method in accordance with the present disclosure. The system 10 may include a controller 12 having a processor 14, a memory 16 (e.g., non-volatile RAM or ROM) and an input/output subsystem 18. The controller 12 communicates with data center components 20, which typically will include computer room air conditioner ("CRAC") units that require a supply air temperature ("SAT") setpoint adjustment. By "setpoint" it is meant a user selected supply air temperature that one wishes the system 10 to maintain. One such widely used cooling system is made by Liebert (a Vertiv company) under the name "DSE Free Cooling System", which is a pumped refrigerant economization system, and the teachings of the present disclosure are fully applicable to this system as well as virtually any other type of room air conditioning system that requires a periodic SAT setpoint adjustment to meet changing room air temperature conditions. The system 10 enables optimal energy efficiency to be obtained in operating a CRAG unit by automatically determining, in part through a plurality of neural network models, an optimal SAT setpoint adjustment to be made that best meets current room temperature and humidity requirements.

With further reference to FIG. 1, the controller 12 acquires data, as indicated at box 22, which may involve applying one or more filters to filter the data to produce a data set which will be used by subsequent processing operations. At operation 24 the collected (and potentially filtered) data set is used via one or more machine learning modules to choose what data is kept for use by neural network models, to train neural network models using selected training algorithms, for example via the Levenberg-Marquardt training algorithm, as well as to decide when to retrain the neural network models and/or to start from scratch with new data. At operation 26, the data may be used in one or more neural network models, as will be described further in the following paragraphs. At operation 28 one or more optimization routines may run. This may involve choosing when to run optimization as well as running an interior-point global optimization algorithm using the collected data, as will also be described more fully in the following paragraphs. The results of operation 26 may be used to supply inputs to the global optimization algorithm. The optimization operation 28 produces a SAT setpoint 30 that may be used by the controller 12 in setting the SAT setpoint applied to one or more of the data center cooling components.

FIG. 2 lists in chart form the different neural networks that the system 10 uses as well as the inputs to each neural network. Neural network ("NN") models are used for "Unit Power" (NN model 26a, also noted as "UP"), which represents cooling unit power consumption; "Remote Air Temp" (NN model 26b, as designated as "RET"), which is the rack inlet temperature of a given data center cooling unit under consideration; "Return Temp", also referred to as "Return Air Temp" or "RAT" (model NN 26c), which is the temperature of air being returned to a given one of the cooling units 20; "Supply Temp", which is also referred to as "Supply Air Temp ("SAT") (NN model 26d), which is the temperature of air being generated and output by the cooling unit; "Fan %" (NN model 26e), which is the percentage of maximum fan speed that a fan of the selected cooling unit is running at; and "Cooling Capacity" (model 26f, as referred to as "CC"), which is the overall cooling capacity (in percentage units, such as percentage compressor capacity or percentage valve opening, etc.) of a given one of the cooling units. It will be noted that the Unit Power neural network 26a may be viewed as the primary or main neural network model, as this model receives inputs from all of the Remote Temp NN model 26b, the Return Temp NN model 26c, the Supply Temp NN model 26d, the Fan % NN model 26e and the Cooling Capacity NN model 26f.

The chart of FIG. 2 also illustrates which ones of the NN models 26b-26f are used as inputs to other ones of the NN models. Some of the variables in the columns of the table shown in FIG. 2 correspond to outputs of the NN models, and "X" in the row indicates that that variable is used as an input to that NN model. For example, it can be seen that outputs from the RAT NN model 26c and the SAT NN model

26*d* are inputs to the Cooling Capacity NN model 26*f*, along with the SAT setpoint and the Return Dew Point Evaporator Heat Rejection ("Qin"). The term "Qin" represents the heat rejected by the cooling unit. More specifically, it is the mass flow rate multiplied by specific heat, which is in turn multiplied by the temperature delta. The neural network models for Remote Temp (RET) 26*b*, Return Air Temp (RAT) 26*c*, Supply Air Temp (SAT) 26*d*, Fan % 26*e* and Cooling Capacity (CC) 26*f* are non-linear constraints to the Unit Power (UP) NN model 26*a*.

Figure 4:
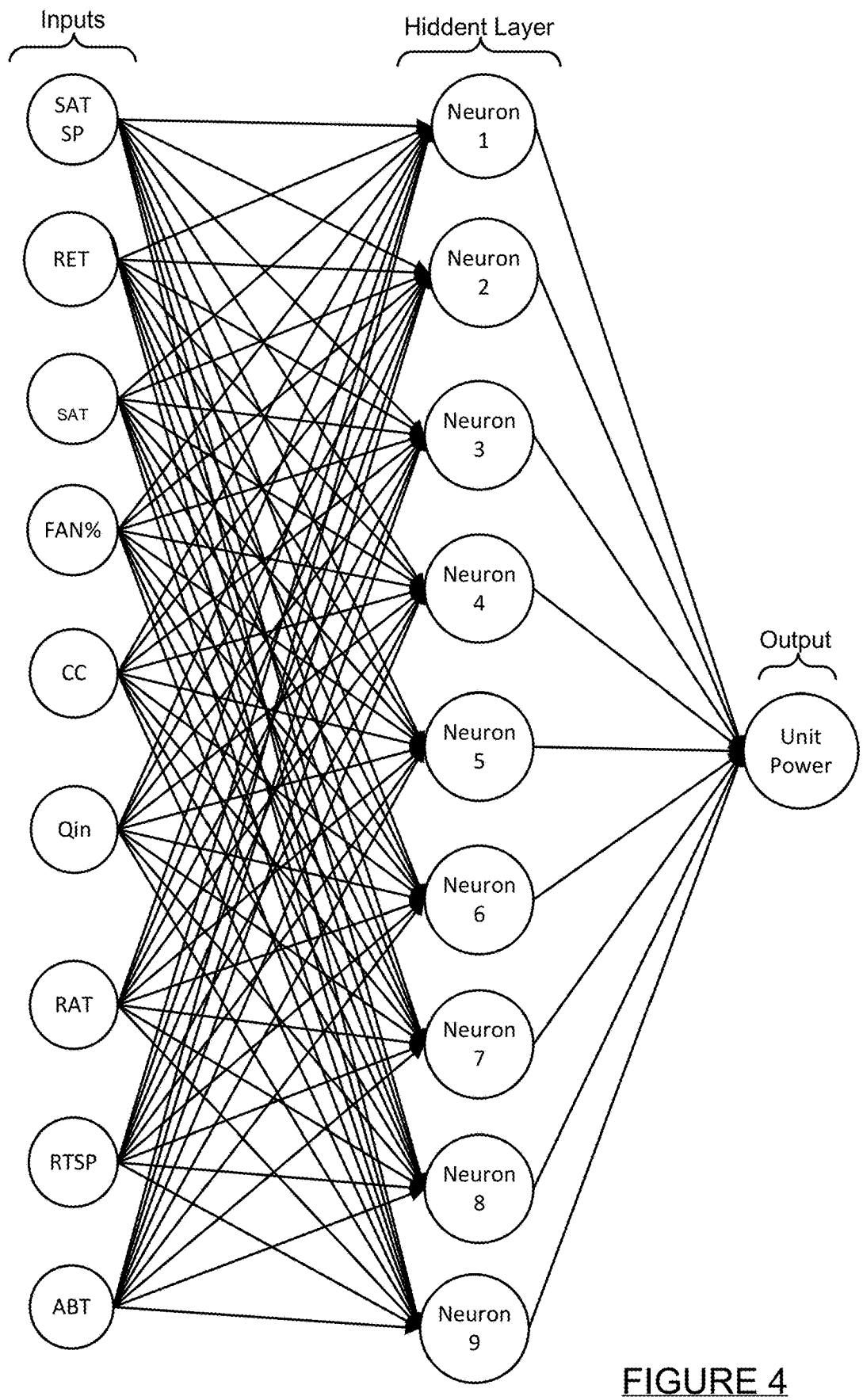
FIG. 4 is a diagram illustrating a neural network model implemented by the present disclosure and the relationship between neural network model inputs, the neurons of a hidden layer of network model, and the Unit Power output.

Referring to FIG. 3, specifics of the machine learning module 24 are shown. The machine learning module 24 may perform supervised learning and regression for the neural network models 25*a*-26*f*. Essentially, the machine learning module 24 uses computational methods to "learn" information directly from collected data, as opposed to using empirical equations/models. Performance improves as the number of learning samples increase. Machine learning also differs from simply using empirical equations/models in that it acts as a "predictive" model which is based on both input and output data. The neural network models 25*a*-26*f* can be deployed on each unique unit (e.g., each CRAC unit) and learn its individual effect on system behavior. Unique system effects on the individual units are captured and reflected in the neural network model. System degradation over time is also captured in the data used to train the neural network models. The machine learning module 24 makes use of an algorithm in which weights applied to each neuron of a hidden layer may automatically be adjusted to help "train" the NN models 25*a*-26*f*, and the data collected may be used to further help train the NN models. In one specific implementation the machine learning module 24 makes use of one hidden layer having 10 neurons, a train ratio of 0.70, a validation ratio of 0.15, and a test ratio of 0.15. This means that 70% of the data is used to train the model while 30% is held in reserve for testing and verification of the model. A MATLAB® program fitnet function in its Neural Network Toolbox is utilized to execute the machine learning algorithm. The machine learning algorithm utilizes regression with neural network (NN) machine learning to model DSE unit power consumption (Unit Power) as a function of the variables: the supply air temperature setpoint (SAT SP), the Supply Air Temperature (SAT), the Return Air Temperature (RAT), Remote Air Temperature (RET), the unit fan speed (Fan %), the unit cooling capacity (CC), the Return Dew Point Evaporator Heat Rejection (Qin); and the parameters: Remote Air Temperature setpoint and ambient temperature. Ambient temperature is the temperature within a room that the cooling unit is located it. FIG. 4 shows a diagram illustrating the relationships between the various neural network model inputs, the hidden layers represented by neurons 1-9, and the output, which is the determined Unit Power (UP) for the cooling unit.

The global optimization module 28 implements a global optimization routine which is run with the DSE unit power consumption model as the objective function. Non-linear constraints used by the global optimization module 28 may include the Remote Air Temp (RET) NN model 26*b*, the Return Air Temp (RAT) NN model 26*c*, the Supply Air Temp (SAT) NN model 26*d*, the Fan % NN model 26*e*, the Cooling Cap (CC) NN model 26*f*, and the Return Dewpoint Evaporator Heat Rejection (Qin) calculation. The SAT SP is modified to minimize unit power consumption and RET, SAT, Remote T, Fan %, and Cooling Cap (CC) non-linear constraints must follow the rules of their respective NN models. The cooling unit energy consumption is reduced by optimizing the proper Supply Air Temperature Setpoint (SAT SP) to the physical room conditions in which the cooling unit is located, and the Remote Air Temperature (RET) requirement is maintained. The need for the user to manually, periodically input the Supply Air Temperature Setpoint (SAT SP) is eliminated. The bounds for the Supply Air Temperature Setpoint (SAT SP) may vary, but in one implementation the SAT may be set anywhere from 55° F. to 75° F. One linear constraint is that the SAT must equal the SAT SP. Optimization points are realized where steady state conditions are achieved, and one hour time duration exists between points unless remote air temperature exceeds a danger threshold at which Supply Air Temp Set Point (SAT SP) can change before the one hour time duration. A MATLAB® program global search optimization algorithm may be used to perform the optimization operations. This algorithm uses an interior-point algorithm.

Figures 6A, 6B:
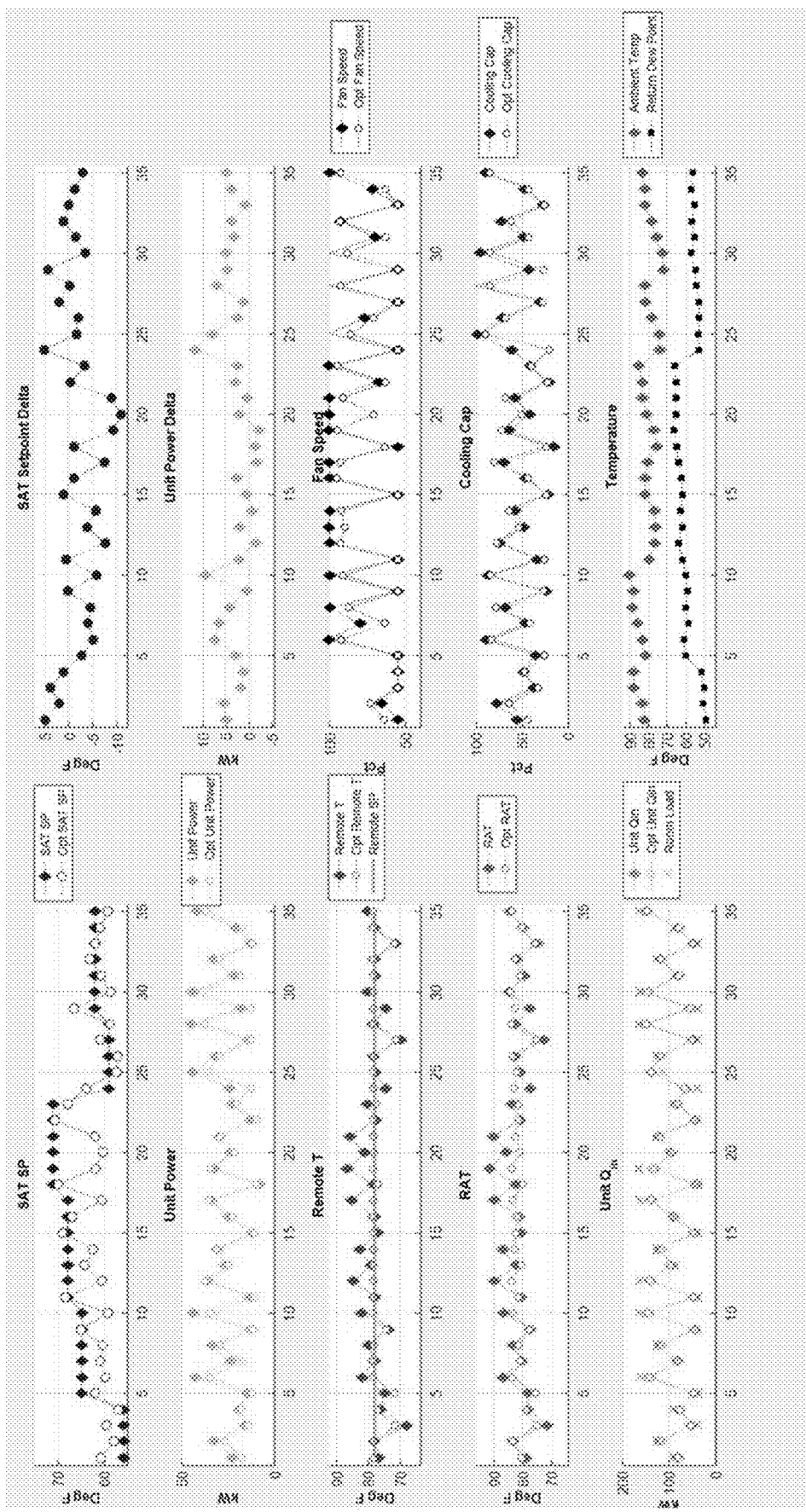
FIGS. 6A and 6B illustrate examples of the performance of the neural network models of the system of FIG. 1 along with a graph showing how closely the Unit Power control achieved by the present disclosure follows a calculated optimal Unit Power for a cooling unit.

During testing, the system 10 has been found to reduce energy consumption of a cooling unit by up to 20% or more. Importantly, the system 10 accomplishes automatic control of the SAT SP, and thus does not require periodic user inputs for the SAT SP. The SAT SP is controlled by the system 10 to optimize (i.e., minimize) energy consumption of the cooling units being managed by the system 10 without violating any important operating or environmental criteria. The graphs of FIGS. 6A and 6B illustrate how a system with the control methodology described herein would work with varying IT loads and initial SAT setpoints as snapshots in time. The global search optimization algorithm of the global optimization module 28 outputs an optimized SAT setpoint to reduce unit power while meeting all constraints or to meet the remote air temperature requirement.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A system for controlling a supply air temperature adjustment for a cooling unit to optimize operation of the cooling unit with respect to at least one of room air temperature and humidity requirements, the system comprising:
    a controller for implementing:
        a machine learning module configured to select which portion or portions of acquired data pertaining to operation of the cooling unit will be utilized;
        a neural network model which uses information supplied by the machine learning module and learns an operational behavior of the cooling unit, and wherein the machine learning module performs supervised learning and regression for the neural network model;
        the neural network model using information supplied by the machine learning module for generating an output; and
        an optimization module which receives the output from the neural network model and which implements a global optimization routine, using unit power consumption of the cooling unit as an objective function, to produce a supply air temperature set point for use by the cooling unit which optimizes an operating parameter of the cooling unit.

2. The system of claim 1, wherein the neural network model comprises a Unit Power neural network module representing cooling unit power consumption, and wherein the Unit Power neural network module receives inputs from at least one other neural network model included within the system.

3. The system of claim 2, wherein the neural network model further comprises a remote air temperature (RET) neural network model representing a rack inlet temperature of the cooling unit, the RET neural network model providing an output to the Unit Power neural network module.

4. The system of claim 1, wherein the neural network model further comprises a supply air temperature (SAT) neural network model for representing a temperature of air being generated and output by the cooling unit.

5. The system of claim 1, wherein the neural network model further comprises a fan percentage neural network model which represents a percentage of maximum fan speed that a fan of the cooling unit is running at.

6. The system of claim 1, wherein the neural network model comprises a cooling capacity (CC) neural network model for representing an overall cooling capacity, in percentage units, of the cooling unit.

7. The system of claim 1, wherein the optimization module receives data from at least one data source and uses the data together with the output from the neural network model when implementing the global optimization routine.

8. A system for controlling a supply air temperature adjustment for a cooling unit to optimize operation of the cooling unit with respect to room air temperature and humidity requirements, the system comprising:
    a controller configured to implement:
        a machine learning module configured to select which portion or portions of acquired data pertaining to operation of the cooling unit are utilized;
        a neural network model which uses information supplied by the machine learning module and learns an operational behavior of the cooling unit, and wherein the machine learning module performs supervised learning and regression for the neural network model;
        the neural network model using information supplied by the machine learning module for generating an output;
        the neural network model having a Unit Power neural network module which receives inputs from at least one other neural network models including:
            a remote air temperature (RET) neural network model representing a rack inlet temperature of the cooling unit, the RET neural network model providing an output to the unit power neural network module; or
            a return air temperature (RAT) neural network model for representing a temperature of air being returned to the cooling unit; or
            a supply air temperature (SAT) neural network model for representing a temperature of air being generated and output by the cooling unit; and
        an optimization module which receives the output from the neural network model and which implements a global optimization routine, using unit power consumption of the cooling unit as an objective function, to produce a supply air temperature set point for use by the cooling unit which optimizes an operating parameter of the cooling unit.

9. The system of claim 8, wherein the neural network model further comprises a fan percentage neural network model which represents a percentage of maximum fan speed that a fan of the cooling unit is running at.

10. The system of claim 8, wherein the neural network model further comprises a cooling capacity (CC) neural network model for representing an overall cooling capacity, in percentage units, of the cooling unit.

11. The system of claim 8, wherein the optimization module receives data from at least one data source and uses the data together with the output from the neural network model when implementing the global optimization routine.

12. A system for controlling a supply air temperature adjustment for a data center cooling unit to optimize operation of the cooling unit with respect to room air temperature and humidity requirements, the system comprising:
    a controller configured to implement:
        a machine learning module configured to select which portion or portions of acquired data pertaining to operation of the cooling unit are utilized;
        a neural network model which uses information supplied by the machine learning module and learns an operational behavior of the cooling unit, and wherein the machine learning module performs supervised learning and regression for the neural network model;
        the neural network model including:
            a Unit Power neural network model representing cooling unit power consumption;
            a remote air temperature (RET) neural network model representing a rack inlet temperature of the cooling unit, the RET neural network model providing an output to the unit power neural network model;
            a return air temperature (RAT) neural network model for representing a temperature of air being returned to a given one of the cooling units;
            a supply air temperature (SAT) neural network model for representing a temperature of air being generated and output by the cooling unit;

a fan percentage neural network model which represents a percentage of maximum fan speed that a fan of the cooling unit is running at;

a cooling capacity (CC) neural network model for representing an overall cooling capacity, in percentage units, of the cooling unit;

the Unit Power neural network model using information supplied by all of the RET, RAT, SAT, fan percentage and CC neural network models in providing an output; and an optimization module which receives the output from the neural network model and which implements a global optimization routine, using unit power consumption of the cooling unit as an objective function, and which produces a supply air temperature set point for use by the cooling unit which optimizes an operating parameter of the cooling unit.

13. The system of claim 12, wherein the optimization module receives data from at least one data source and uses the data together with the output from the neural network model when implementing the global optimization routine.

\* \* \* \* \*